United States Patent
Kelley et al.

(10) Patent No.: US 7,362,571 B2
(45) Date of Patent: Apr. 22, 2008

(54) INLET FLOW CONDITIONERS FOR COMPUTER CABINET AIR CONDITIONING SYSTEMS

(75) Inventors: Douglas P. Kelley, Seattle, WA (US); Alexander I. Yatskov, Seattle, WA (US)

(73) Assignee: Cray Inc., Seattle, WA (US)

( * ) Notice: Subject to any disclaimer, the term of this patent is extended or adjusted under 35 U.S.C. 154(b) by 218 days.

(21) Appl. No.: 11/227,832

(22) Filed: Sep. 15, 2005

(65) Prior Publication Data
US 2006/0068695 A1    Mar. 30, 2006

Related U.S. Application Data

(60) Provisional application No. 60/610,517, filed on Sep. 16, 2004.

(51) Int. Cl.
H05K 7/20 (2006.01)
(52) U.S. Cl. .............. 361/694; 361/695; 454/184
(58) Field of Classification Search .............. 361/695; 454/184
See application file for complete search history.

(56) References Cited

U.S. PATENT DOCUMENTS

| | | | |
|---|---|---|---|
| 3,317,798 A | | 5/1967 | Chu et al. |
| 3,903,404 A | * | 9/1975 | Beall et al. .............. 361/687 |
| 4,315,300 A | | 2/1982 | Parmerlee et al. |
| 4,874,127 A | * | 10/1989 | Collier .............. 236/49.5 |
| 5,000,079 A | * | 3/1991 | Mardis .............. 454/184 |
| 5,035,628 A | | 7/1991 | Casciotti et al. |
| 5,150,277 A | | 9/1992 | Bainbridge et al. |
| 5,161,087 A | | 11/1992 | Frankeny et al. |
| 5,273,438 A | | 12/1993 | Bradley |
| 5,329,425 A | | 7/1994 | Leyssens et al. |
| 5,339,214 A | | 8/1994 | Nelson |
| 5,345,779 A | * | 9/1994 | Feeney .............. 62/259.2 |

(Continued)

FOREIGN PATENT DOCUMENTS

JP    2004-79754    8/2002

(Continued)

OTHER PUBLICATIONS

Baer, D.B., "Emerging Cooling Requirements & Systems in Telecommunications Spaces," Telecommunications Energy Conference 2001, Oct. 14-18, 2001, pp. 95-100.

(Continued)

Primary Examiner—Gregory D Thompson
(74) Attorney, Agent, or Firm—Perkins Coie LLP

(57) ABSTRACT

Flow conditioners for use with air inlets on computer cabinets are disclosed herein. In one embodiment, a large computer system includes a plurality of computer cabinets arranged in close proximity to each other. Each of the computer cabinets can include a fan, impellor, or other air mover positioned proximate to an inlet that receives cooling air from a plenum, such as a floor plenum. In this embodiment, a flow conditioner configured in accordance with the present invention can be positioned proximate to the air inlet. The flow conditioner can include a vortex diffuser and a flow-speed normalizer. The flow-speed normalizer can include a perforated screen that forms a cylinder around the inlet, and the vortex diffuser can include one or more vanes that extend across the cylinder adjacent to the inlet.

26 Claims, 3 Drawing Sheets

U.S. PATENT DOCUMENTS

| | | | |
|---|---|---|---|
| 5,376,008 A | 12/1994 | Rodriguez | |
| 5,395,251 A | 3/1995 | Rodriguez et al. | |
| 5,402,313 A | 3/1995 | Casperson et al. | |
| 5,410,448 A | 4/1995 | Barker, III et al. | |
| 5,572,403 A | 11/1996 | Mills | |
| 5,718,628 A * | 2/1998 | Nakazato et al. | 454/184 |
| 6,046,908 A | 4/2000 | Feng | |
| 6,115,242 A | 9/2000 | Lambrecht | |
| 6,158,502 A | 12/2000 | Thomas | |
| 6,167,948 B1 | 1/2001 | Thomas | |
| 6,310,773 B1 | 10/2001 | Yusuf et al. | |
| 6,416,330 B1 | 7/2002 | Yatskov | |
| 6,435,266 B1 | 8/2002 | Wu | |
| 6,515,862 B1 | 2/2003 | Wong et al. | |
| 6,519,955 B2 | 2/2003 | Marsala | |
| 6,557,357 B2 * | 5/2003 | Spinazzola et al. | 62/89 |
| 6,564,858 B1 | 5/2003 | Stahl | |
| 6,644,384 B2 | 11/2003 | Stahl | |
| 6,679,081 B2 | 1/2004 | Marsala | |
| 6,772,604 B2 * | 8/2004 | Bash et al. | 62/259.2 |
| 6,776,707 B2 * | 8/2004 | Koplin | 454/184 |
| 6,992,889 B1 | 1/2006 | Kashiwagi et al. | |
| 7,051,946 B2 * | 5/2006 | Bash et al. | 236/49.3 |
| 2001/0052412 A1 | 12/2001 | Tikka | |
| 2002/0181200 A1 | 12/2002 | Chang | |
| 2003/0056941 A1 | 3/2003 | Lai et al. | |
| 2004/0008491 A1 | 1/2004 | Chen | |
| 2004/0052052 A1 | 3/2004 | Rivera | |
| 2005/0120737 A1 | 6/2005 | Borror et al. | |
| 2005/0168945 A1 | 8/2005 | Coglitore | |
| 2005/0225936 A1 * | 10/2005 | Day | 361/687 |

FOREIGN PATENT DOCUMENTS

| | | |
|---|---|---|
| WO | WO-01/86217 A1 | 11/2001 |
| WO | WO-2005/027609 | 3/2005 |

OTHER PUBLICATIONS

Hannemann, Robert et al., "Pumped Liquid Multiphase Cooling," ASME, Nov. 13-19, 2004, IMECE 2004, Paper IMECE2004-60669, Anaheim, CA, 5 pages.

Webb, Warren, "Take the heat: Cool that hot embedded design," *EDN*, May 13, 2004, 5 pages.

* cited by examiner

INLET FLOW CONDITIONERS FOR COMPUTER CABINET AIR CONDITIONING SYSTEMS

CROSS-REFERENCE TO RELATED APPLICATION

This application claims the benefit of U.S. Provisional Application No. 60/610,517, filed Sep. 16, 2004, currently pending and incorporated herein in its entirety by reference.

TECHNICAL FIELD

The following disclosure relates generally to air conditioning systems for computer cabinets and, more particularly, to inlet flow conditioners for computer cabinets.

BACKGROUND

Supercomputers typically include a large number of computer cabinets arranged in close proximity to each other. FIG. 1A, for example, is a top view of a supercomputer system 100 having a plurality of computer cabinets 110 arranged in banks (the computer cabinets 110 are identified individually as computer cabinets 110a-o). The computer cabinets 110 are arranged in banks to conserve floor space and increase computational speed by reducing cable lengths between cabinets.

FIG. 1B is a side view of the supercomputer system 100 of FIG. 1A. As this view illustrates, each of the computer cabinets 110 includes a plurality of computer module compartments 118 (identified individually as module compartments 118a-c). Each module compartment 118 holds a plurality of computer modules 112 in close proximity to each other. Each of the computer modules 112 can include a motherboard electrically connecting processors, routers, and/or other electronic devices together for data and/or power transmission.

Many of the electronic devices typically found on the computer modules 112 generate a considerable amount of heat during operation. This heat can damage the devices and/or degrade performance if not dissipated during operation. To overcome this problem, the computer system 100 includes a plurality of air handlers 120 (identified individually as air handlers 120a-d). The air handlers 120 draw in warm air from the surrounding room and cool the air before flowing it into a plenum 124 that extends beneath a floor 125. Air movers 116 positioned in each of the computer cabinets 110 draw the cooling air upward from the floor plenum 124 through corresponding inlets 114. The air movers 116 typically include rotating fan or impellor blades. After flowing past the computer modules 112, the cooling air exits each of the computer cabinets 110 via a corresponding outlet 115. The warmed air then circulates back to the air handlers 120 as part of a continual cooling cycle.

One shortcoming of the supercomputer system 100 is that the air movers 116 can generate a significant amount of noise during operation. Not only does this noise make working around the system uncomfortable, but it can also be an indication that the air movers 116 are experiencing flow instability. In the case of fan or impellor blades, this instability could damage the air mover, reduce air flow, or shorten the life of the motor bearings.

Another shortcoming associated with the supercomputer system 100 is that the computer cabinets 110 tend to receive a non-uniform flow of cooling air from the air handlers 120. This imbalance can result from a number of factors, including the placement of the computer cabinets 110 relative to the air handlers 120, and/or whether one or more of the air movers 116 has been turned off for maintenance or other reasons. Because of this imbalance, some of the computer cabinets 110 may receive an insufficient flow of cooling air, resulting in overheating of the computer modules, while others receive an excessive flow, resulting in wasted energy.

One approach to solving this problem is to increase the overall output from the air handlers 120. This approach is often impractical, however, because of the high cost of constructing and operating such high-capacity air conditioning systems. In addition, this approach tends to require larger fans, increased cooling flows, and more power than many computer facilities were originally designed to provide or accommodate. Furthermore, such an approach may actually worsen the flow imbalance problem in some situations. Not to mention the fact that such systems are typically very noisy, creating a difficult work environment for facility personnel.

DETAILED DESCRIPTION

The following disclosure describes several embodiments of inlet flow conditioners for use with computer cabinet air-conditioning systems. Specific details of several embodiments of the invention are described below with reference to FIGS. 2 and 3 to provide a thorough understanding of the embodiments. Other details describing well-known structures and systems often associated with computer cabinets and related air conditioning systems, however, are not set forth below to avoid unnecessarily obscuring the description of the various embodiments.

Those of ordinary skill in the art will understand that the invention may have other embodiments in addition to those described below. Such embodiments may lack one or more of the elements described herein. Furthermore, such embodiments may include other elements in addition to those described herein.

In the Figures, identical reference numbers identify identical or at least generally similar elements. To facilitate the discussion of any particular element, the most significant digit or digits of any reference number refers to the Figure in which that element is first introduced. Element 210, for example, is first introduced and discussed with reference to FIG. 2.

Figure 1A:
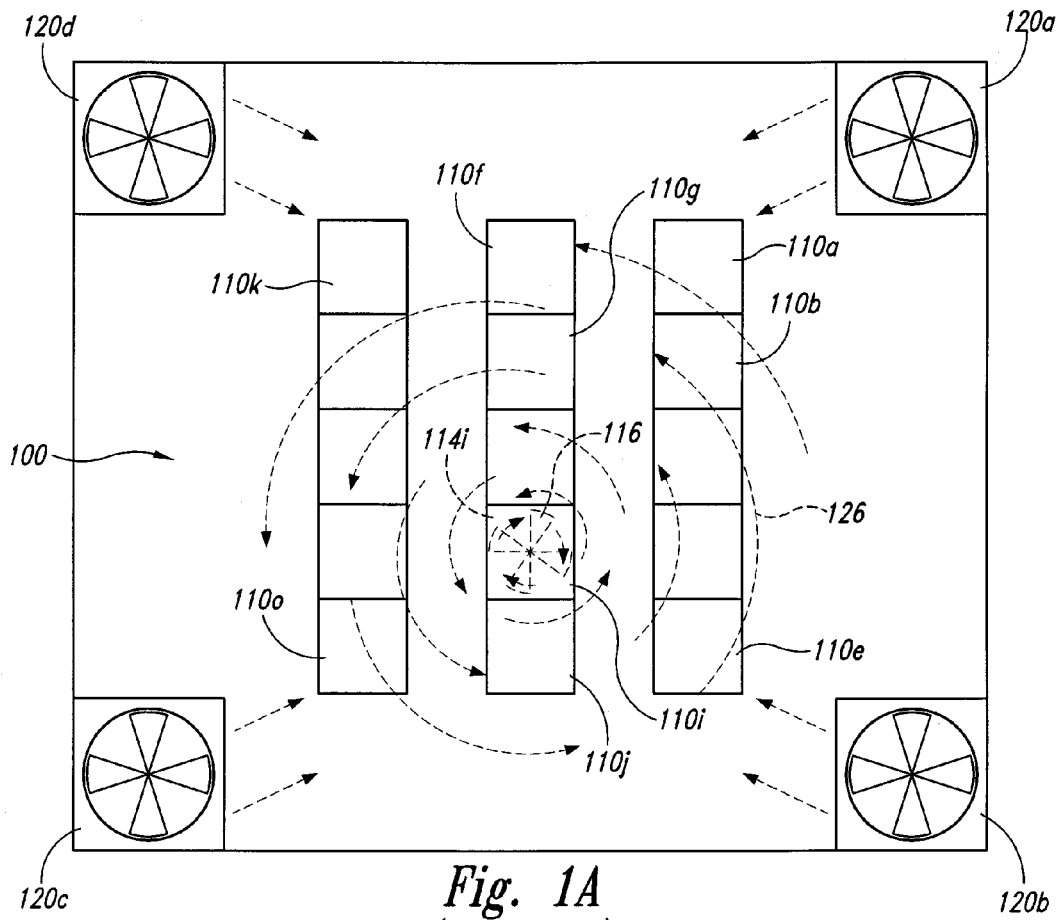
FIG. 1A is a top view.
Figure 1B:
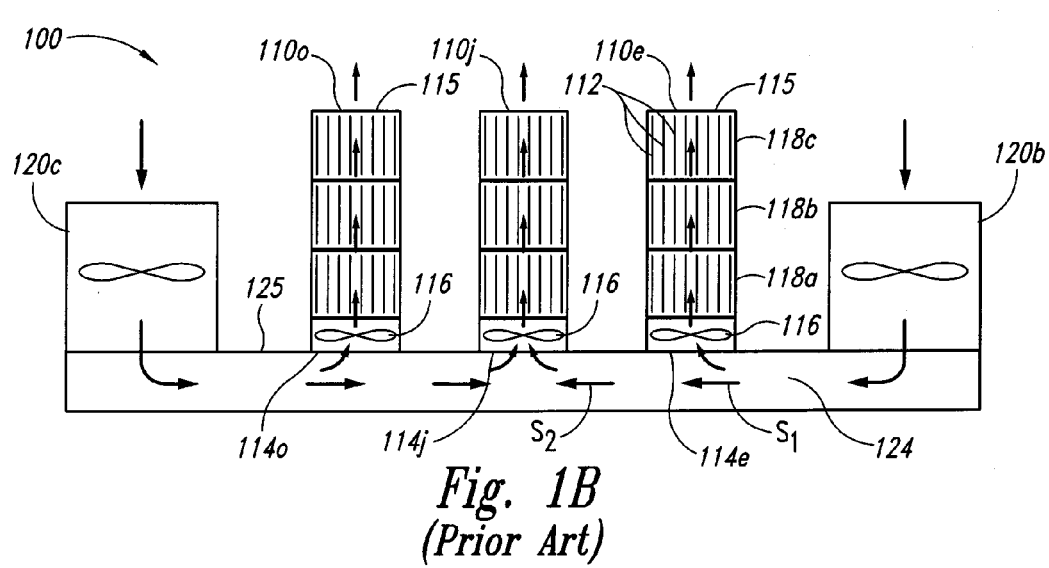
FIG. 1B is a corresponding side view, of a supercomputer system having a plurality of computer cabinets without inlet flow conditioners.

As discussed above with reference to FIGS. 1A and 1B, noise reduction is a concern facing supercomputer system operators. One factor that contributes to the overall noise level is the interaction between the air movers 116 and the flow of cooling air coming from the floor plenum 124. In certain circumstances, the cooling air can form vortices in the floor plenum 124 that flow counter to the rotation of the individual air movers 116. For example, FIG. 1A illustrates a vortex 126 that flows counterclockwise around the inlet 114i of the computer cabinet 110i. In this example, the air mover 116 in the computer cabinet 110*i* rotates in the opposite, clockwise direction.

The vortex 126 can form in a number of different ways during normal operation of the computer system 100. One way such a vortex can form is by turning off one or more of the air handlers 120 for maintenance or other reasons. For example, if the fourth air handler 120*d* is turned off, the flow from the remaining three air handlers 120 could produce the counterclockwise vortex 126. Turning off the second air handler 120*b* in addition to the fourth air handler 120*d* would presumably increase the strength of the vortex 126.

Another way to inadvertently cause the vortex 126 is to turn off one or more of the air movers 116 for cabinet maintenance or other reasons. For example, if the air movers 116 in the computer cabinets 110*a, b, f,* and *g* were all turned off, then much of the air from the first air handler 120*a* would pass by the inlets to these cabinets and contribute to formation of the vortex 126. Removing one or more panels from the floor 125 in a particular pattern could also contribute to vortex formation. Regardless of how the vortex 126 is formed, the end result can be flow-shearing, cavitation, stagnation, and/or other phenomena that increase noise and reduce flow efficiency.

For purposes of illustration, the foregoing discussion focuses on a vortex (e.g., the vortex 126) that runs counter to the direction of rotation of an affected air mover. However, even a vortex the flows in the same direction as the air mover can cause a significant reduction in static air pressure, thereby reducing the air flow through the corresponding computer cabinet. Thus, aspects of the present invention are not limited to addressing counter-rotating vortex phenomenon, but extend to other phenomena (e.g., turbulence, eddy currents, etc.) that can result in flow inefficiencies.

As discussed above with reference to FIGS. 1A and 1B, balancing the distribution of cooling air is also a concern facing supercomputer system operators. One factor that contributes to un-balanced flow is having different air flow speeds at different locations within the floor plenum 124. For purposes of illustration only, FIG. 1A illustrates an example where cooling air has a first speed $S_1$ proximate to the fifth computer cabinet 110*e*, and a second speed $S_2$ proximate to the tenth computer cabinet 110*j*. The first speed $S_1$ may be greater than the second speed $S_2$ because of the proximity to the second air handler 120*b*. As those of skill in the art are aware, the static pressure of a fluid flow drops as the flow speed increases. Accordingly, the static pressure of the air flow at $S_1$ is lower than the static pressure of the air flow at $S_2$. As a result, the tenth computer cabinet 110*j* will receive a proportionately higher amount of cooling air than the fifth computer cabinet 110*e*.

Figure 2:
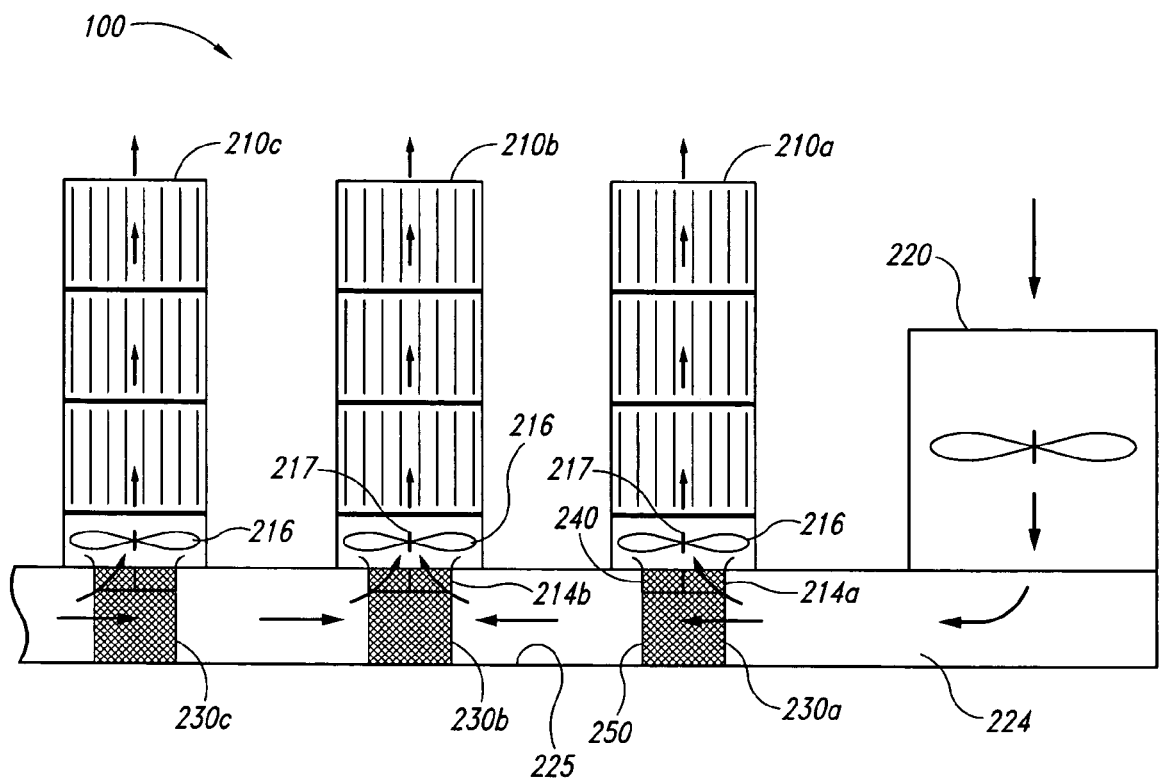
FIG. 2 is an elevation view of a supercomputer system having a plurality of computer cabinets with inlet flow conditioners configured in accordance with an embodiment of the invention.

FIG. 2 is an elevation view of a supercomputer system 200 that includes a plurality of flow conditioners 230 (identified individually as flow conditioners 230*a-c*) configured in accordance with an embodiment of the invention. Many aspects of the supercomputer system 200 are at least generally similar in structure and function to the supercomputer system 100 described above with reference to FIGS. 1A-B. For example, the supercomputer system 200 includes at least one air handler 220 that provides cooling air to computer cabinets 210*a-c* via a floor plenum 224. Each computer cabinet 210 includes a corresponding air mover 216 that draws cooling air into the computer cabinet 210 from the floor plenum 224 via a corresponding inlet 214 (e.g., a first inlet 214*a* and a second inlet 214*b*). In the illustrated embodiment, each of the air movers 216 includes impellor or fan blades configured to rotate about a central axis 217 to draw air into the computer cabinet 210.

The flow conditioners 230 of the present invention are positioned beneath the inlets 214 of the computer cabinets 210. Each of the flow conditioners 230 includes a vortex diffuser 240 and a flow-speed normalizer 250. These features are described in greater detail below with reference to FIG. 3.

Figure 3:
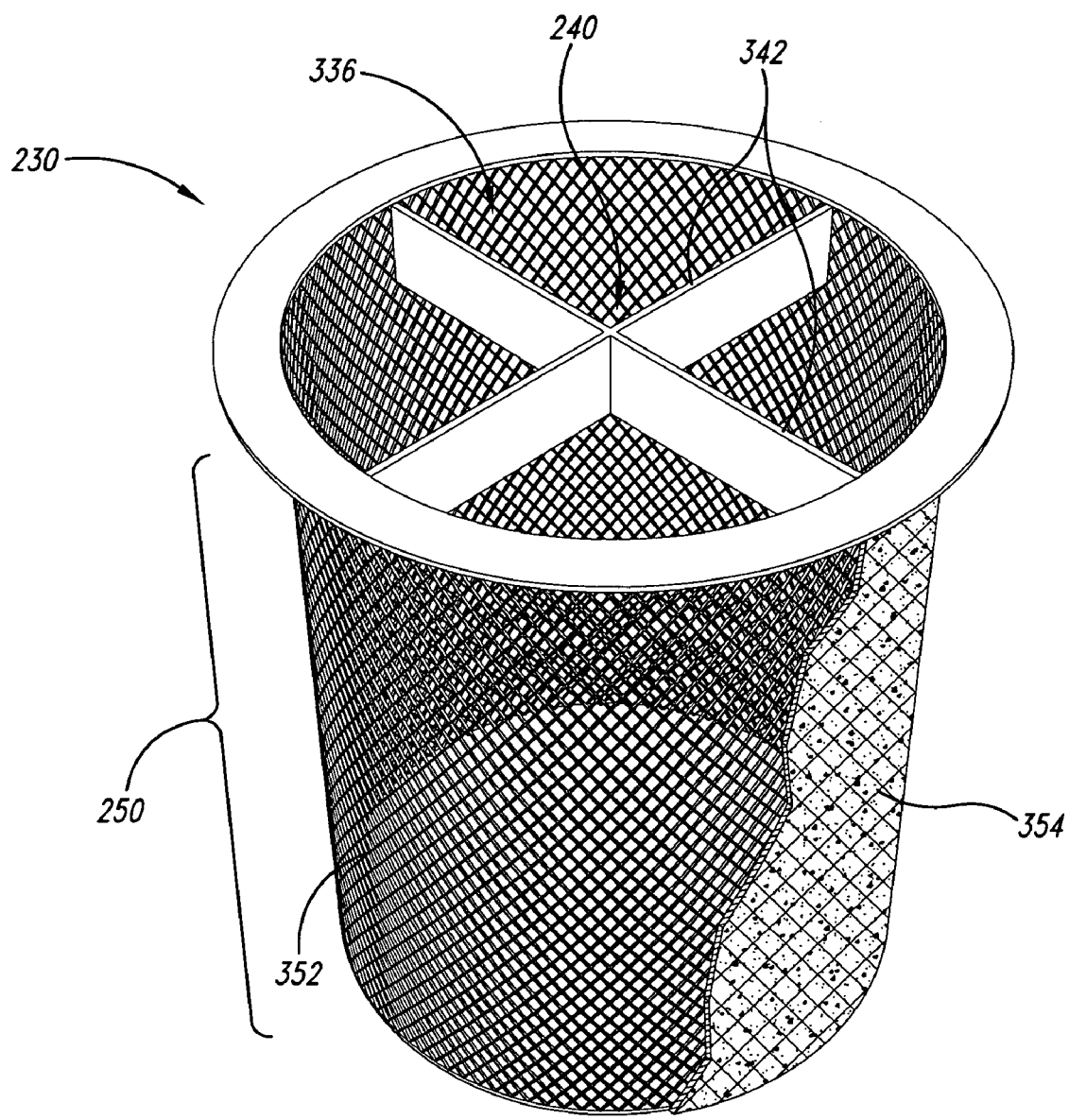
FIG. 3 is an enlarged isometric view of the inlet flow conditioner of FIG. 2.

FIG. 3 is an enlarged isometric view of one of the flow conditioners 230 of FIG. 2. In one aspect of this embodiment, the flow-speed normalizer 250 includes a perforated enclosure 352. In the illustrated embodiment, the perforated enclosure 352 includes a screen wrapped in a cylinder and having a circular opening 336. In other embodiments, however, the perforated enclosure 352 can have other shapes without departing from the spirit or scope of the present invention. Such shapes can include, for example, cones, rectangles, triangles, octagons, etc. The perforated enclosure 352 can be made from a number of different suitable materials, including wire screen or mesh (as illustrated in FIG. 3), plastic screen or mesh, perforated sheet metal, perforated plastic, etc.

In the illustrated embodiment, the flow conditioner 230 extends the full height of the floor plenum 224. In other embodiments, however, the flow conditioner 230 can be made shorter so that it does not extend all the way to a lower floor surface 225. Such embodiments leave the lower floor surface 225 open to facilitate movement of cables, etc., between the various computer cabinets and other equipment.

In another aspect of this embodiment, the flow conditioner 230 can further include a filter 354 wrapped around the perforated enclosure 352 (the filter 354 is shown partially cut away in FIG. 3 for purposes of clarity). The filter 354 can be made from a number of suitable materials known in the art for preventing dust and/or other particulate matter (e.g., candy wrappers, etc.) from flowing into the computer cabinets 210. Such materials can include, for example, paper, plastic, and fiber filter media. In other embodiments, the filter 354 can be omitted.

The vortex diffuser 240 can include at least one straightening vane 342 that extends across the opening 336 of the perforated enclosure 352. In the illustrated embodiment, for example, the vortex diffuser 342 includes two straightening vanes 342 arranged in a cross-pattern parallel to the direction of cooling air moving through the computer cabinet 210. In this embodiment, the two vanes 342 cross at a point that is at least approximately aligned with the central axis 217 of the air mover 216 (FIG. 2) when the flow conditioner 230 is installed in the floor plenum 224. In other embodiments, however, the vortex diffuser 240 can include other vane arrangements. Such arrangements can include, for example, an arrangement of parallel vanes, or an arrangement of vanes in a grid pattern.

In further embodiments, the vortex diffuser 240 can include yet other devices for directing air flow. Such devices can include, for example, a grid of flow-through cells having circular, octagonal (e.g., a honeycomb grid), rectangular, or other shapes for channeling air flow. Accordingly, the present invention is not limited to the particular vortex diffuser configuration illustrated in FIG. 3.

Referring to FIGS. 2 and 3 together, in operation, the air handler 220 provides cooling air to the flow conditioners 230 via the floor plenum 224. As the cooling air flows through the perforated sidewall portions of the individual flow conditioners 230, the perforated enclosures 352 reduce the air speed. In one aspect of this embodiment, the reduction in speed is proportional to the flow speed. Hence, high-speed air will experience a proportionally greater speed reduction than low-speed air. As a result, the relative speeds of the cooling air in the floor plenum 124 will be "normalized," at least to some degree, across all the inlets 214 of the computer cabinets 210. Normalizing the local flow speeds in this manner can result in a more uniform distribution of cooling air between the computer cabinets 210.

After the cooling air flows though the perforated enclosure 352, it flows into the vortex diffuser 240. The vanes 342 of the vortex diffuser 240 align the flow with the central axis 217 of the air mover 216 to reduce any undesirable flow interaction (e.g., flow-shearing, turbulence, etc.) that may cause noise and/or reduce flow efficiency. The perforated enclosure 352 can also contribute somewhat to flow alignment with the air mover 216.

An advantage of the flow conditioners 230 described above is that they can increase and/or balance air flow through the computer cabinets 210. In one particular analysis, for example, it was found that by restricting the inlets 214 with the flow conditioners 230, the average air flow through the cabinets 210 increased by about 10-30% and became more balanced among the different cabinets. Another advantage of the flow conditioners 230 is that they can reduce air mover vibration, thereby reducing load on associated bearings, motors, etc. Reducing the load reduces the wear on these parts, and can increase the time intervals between service and inspections. This is especially important for computer cabinets that lack redundant (i.e., back-up) cooling fans.

Although the flow conditioner 230 described above includes both the vortex diffuser 240 and the flow-speed normalizer 250 for purposes of illustration, in other embodiments, a flow conditioner can lack one or the other of these features without departing from the spirit or scope of the present disclosure. For example, in other embodiments, a flow conditioner can include the flow-speed normalizer 250 without the vortex diffuser 240. Such an embodiment may be desirable, for example, in those situations where the corresponding computer cabinet lacks an air mover proximate to the cooling air inlet, thereby reducing the need for flow alignment at the inlet. In other embodiments, a flow conditioner can include the vortex diffuser 240 without the flow-speed normalizer 250.

Vortices can be caused by pressure differentials between high pressure areas (e.g., air handler outlets) and low pressure areas (e.g., computer cabinet inlets) deflecting and accelerating (locally) high velocity air streams. In this regard, the flow-speed normalizer can 250 reduce the flow velocity, pressure differentials, and associated disturbances proximate to the computer cabinet inlet. It one configuration, for example, it was found that a flow-speed normalizer that restricted the inlet flow by about 50-75% could stop vibration of the associated air mover completely. However, in some cases, a 50-75% flow restriction results in insufficient cabinet cooling. Thus, in such situations the flow conditioner 230 can further include the vortex diffuser 240 to help align the flow into the air mover without significantly restricting the flow.

The terms "vortex diffuser" and "flow-speed normalizer" have been used herein for ease of reference. Accordingly, these terms should not be read to limit the various structural and/or functional features of these elements.

From the foregoing, it will be appreciated that specific embodiments of the invention have been described herein for purposes of illustration, but that various modifications may be made without deviating from the spirit and scope of the invention. For example, although elements of the invention described above have been presented in one or more arrangements, in other embodiments, other arrangements are possible depending on the particular situation. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

We claim:

1. A flow conditioner for use with a computer cabinet having a cooling air inlet, the flow conditioner comprising:
   a perforated enclosure having an opening configured to be positioned adjacent to the computer cabinet inlet, wherein the perforated enclosure further includes a perforated sidewall portion extending from the opening and through which cooling air flows before flowing out the opening and into the computer cabinet through the inlet; and
   at least a first vane extending at least partially across the opening in the perforated enclosure.

2. The flow conditioner of claim 1 wherein the perforated enclosure forms a cylinder.

3. The flow conditioner of claim 1 wherein the perforated enclosure includes screen material forming a circular cylinder.

4. The flow conditioner of claim 1 wherein the opening in the perforated enclosure is at least generally circular, and wherein the first vane is a planar member that extends across the opening.

5. The flow conditioner of claim 1 wherein the computer cabinet is positioned above a floor plenum that directs cooling air to the computer cabinet inlet, and wherein the flow conditioner is configured to fit within the floor plenum adjacent to the computer cabinet inlet.

6. The flow conditioner of claim 1, further comprising a second vane extending at least partially across the opening in the perforated enclosure.

7. The flow conditioner of claim 1, further comprising a second vane extending at least partially across the opening in the perforated enclosure and crossing the first vane.

8. The flow conditioner of claim 1 wherein the perforated enclosure includes screen material forming a circular cylinder, wherein the opening in the perforated enclosure is at least generally circular, and wherein the flow conditioner further comprises a second vane extending at least partially across the circular opening and crossing the first vane.

9. The flow conditioner of claim 1 wherein the perforated enclosure includes screen material forming a cylinder, and wherein the flow conditioner further comprises a filter layer positioned around the screen material.

10. A flow conditioner for use with a computer cabinet having an air mover positioned proximate to an inlet, wherein the air mover is configured to rotate about a central axis, and wherein the flow conditioner comprises:
    a perforated enclosure having a circular opening and a perforated sidewall portion extending from the circular opening, the circular opening being configured to be positioned adjacent to the inlet of the computer cabinet and at least approximately aligned with the central axis of the air mover;
    a first planar member extending across the circular opening of the cylindrical enclosure; and
    a second planar member extending across the circular opening of the cylindrical enclosure and crossing the first planar member at a point configured to be at least approximately aligned with the central axis of the air mover.

11. The flow conditioner of claim 10 wherein the perforated enclosure includes a screen forming a circular cylinder.

12. The flow conditioner of claim 10 wherein the perforated enclosure includes a screen forming a circular cylinder, and wherein the flow conditioner further comprises a layer of filter material extending at least partially around the outside of the circular cylinder.

13. The flow conditioner of claim 10 wherein the first and second planar members are oriented edgewise relative to the central axis of the air mover.

14. A computer system comprising:
an air plenum;
an air handler configured to flow cooling air into the air plenum;
a computer cabinet having an inlet configured to receive cooling air from the air plenum;
an air mover positioned proximate to the computer cabinet, wherein the air mover is configured to move cooling air from the air plenum through the computer cabinet; and
a flow conditioner positioned in the air plenum, the flow conditioner having an opening generally aligned with the inlet of the computer cabinet and a perforated sidewall portion extending from the opening and at least partially around the inlet to the computer cabinet, wherein at least a portion of the cooling air flows through the perforated sidewall portion before flowing into the computer cabinet through the inlet.

15. The computer system of claim 14 wherein the air mover is positioned in a lower portion of the computer cabinet proximate to the inlet.

16. The computer system of claim 14 wherein the computer cabinet is supported by a floor, and wherein the air plenum extends beneath the floor.

17. A computer system comprising:
an air plenum;
an air handler configured to flow cooling air into the air plenum;
a computer cabinet having an inlet configured to receive cooling air from the air plenum;
an air mover positioned proximate to the computer cabinet, wherein the air mover is configured to move cooling air from the air plenum through the computer cabinet; and
a flow conditioner positioned in the air plenum, the flow conditioner having a perforated sidewall portion extending at least partially around the inlet to the computer cabinet, wherein at least a portion of the cooling air flows through the perforated sidewall portion before flowing into the computer cabinet through the inlet, wherein the air mover includes an impellor configured to rotate about a central axis, wherein the flow conditioner includes an opening aligned with the central axis, and wherein at least a portion of the cooling air flows through the perforated sidewall portion of the flow conditioner before flowing out of the opening and into the computer cabinet through the inlet.

18. The computer system of claim 14 wherein the flow conditioner includes an opening positioned adjacent to the inlet of the computer cabinet, and wherein the flow conditioner further includes at least one vane extending across the opening.

19. A computer system comprising:
an air plenum;
an air handler configured to flow cooling air into the air plenum;
a computer cabinet having an inlet configured to receive cooling air from the air plenum;
an air mover positioned proximate to the computer cabinet, wherein the air mover is configured to move cooling air from the air plenum through the computer cabinet; and
a flow conditioner positioned in the air plenum, the flow conditioner having a perforated sidewall portion extending at least partially around the inlet to the computer cabinet, wherein at least a portion of the cooling air flows through the perforated sidewall portion before flowing into the computer cabinet through the inlet, wherein the air mover includes an impellor configured to rotate about a central axis, wherein the flow conditioner includes a circular opening aligned with the central axis, and wherein the flow conditioner further includes:
a first vane extending across the circular opening; and
a second vane extending across the circular opening, the second vane crossing the first vane at a point at least approximately aligned with the central axis of the impellor.

20. The computer system of claim 14 wherein the computer cabinet is a first computer cabinet, the inlet is a first inlet, the air mover is a first air mover, and the flow conditioner is a first flow conditioner having a first perforated sidewall portion, and wherein the computer system further comprises:
a second computer cabinet having a second inlet configured to receive cooling air from the air plenum;
a second air mover positioned proximate to the second computer cabinet, wherein the second air mover is configured to move cooling air from the air plenum through the second computer cabinet; and
a second flow conditioner positioned in the air plenum, the second flow conditioner having a second perforated sidewall portion extending at least partially around the second inlet to the second computer cabinet, wherein at least a portion of the cooling air flows through the second sidewall portion of the second flow conditioner before flowing into the second computer cabinet through the second inlet.

21. The computer system of claim 14 wherein the air mover is configured to move cooling air along an air flow path through the computer cabinet, and wherein the computer cabinet further includes:
a first computer module compartment positioned in the air flow path; and
a second computer module compartment positioned in the air flow path above the first computer module compartment.

22. The computer system of claim 14 wherein the air mover is configured to move cooling air along an air flow path through the computer cabinet, and wherein the computer cabinet further includes:
a first computer module compartment;
a first computer module carried in the first computer module compartment and oriented edgewise with respect to the air flow path;
a second computer module compartment positioned above the first computer module compartment; and
a second computer module carried in the second computer module compartment and oriented edgewise with respect to the air flow path.

23. A method for conditioning cooling air before flowing it into an air mover in a computer cabinet, the method comprising:

passing the cooling air through a perforated screen positioned proximate to an inlet of the computer cabinet to at least partially normalize the flow speed of the cooling air, the perforated screen having an opening generally aligned with the inlet of the computer cabinet and a perforated sidewall portion extending from the opening; and passing the cooling air past at least one vane positioned proximate to the inlet to at least partially diffuse any vortices in the cooling air.

24. The method of claim 23, further comprising cooling the air before passing the air through the perforated screen.

25. The method of claim 23, further comprising driving the cooling air into a plenum positioned beneath the computer cabinet before passing the air through the perforated screen.

26. The method of claim 23, further comprising:

positioning a first air handler toward a first side of the computer cabinet;

positioning a second air handler toward a second side of the computer cabinet;

driving a first portion of cooling air from the first air handler into a plenum positioned beneath the computer cabinet before passing the first portion of cooling air through the perforated screen; and driving a second portion of cooling air from the second air handler into the plenum before passing the second portion of cooling air through the perforated screen.

* * * * *